United States Patent
Ikehata

(10) Patent No.: US 9,014,645 B2
(45) Date of Patent: Apr. 21, 2015

(54) WIRELESS COMMUNICATION DEVICE, METHOD FOR CONTROLLING WIRELESS COMMUNICATION DEVICE, PROGRAM, AND STORAGE MEDIUM

(75) Inventor: Kazuhiko Ikehata, Osaka-shi (JP)

(73) Assignee: Sharp Kabushiki Kaisha, Osaka (JP)

( * ) Notice: Subject to any disclaimer, the term of this patent is extended or adjusted under 35 U.S.C. 154(b) by 119 days.

(21) Appl. No.: 13/881,116

(22) PCT Filed: Oct. 24, 2011

(86) PCT No.: PCT/JP2011/074433
§ 371 (c)(1),
(2), (4) Date: Apr. 23, 2013

(87) PCT Pub. No.: WO2012/057078
PCT Pub. Date: May 3, 2012

(65) Prior Publication Data
US 2013/0225098 A1    Aug. 29, 2013

(30) Foreign Application Priority Data
Oct. 25, 2010   (JP) ................................. 2010-238779

(51) Int. Cl.
*H04B 1/40* (2006.01)
*H03H 7/40* (2006.01)
*H04B 1/18* (2006.01)

(52) U.S. Cl.
CPC . *H04B 1/40* (2013.01); *H03H 7/40* (2013.01); *H04B 1/18* (2013.01)

(58) Field of Classification Search
CPC .............. H04B 1/40; H04B 1/04; H04B 1/18; H01Q 11/12

USPC ........................ 455/121, 129, 193.1, 77, 63.1
See application file for complete search history.

(56) References Cited

U.S. PATENT DOCUMENTS 6,219,532 B1    4/2001  Tanaka et al.
7,502,598 B2 *  3/2009  Kronberger et al. .......... 455/123
(Continued)

FOREIGN PATENT DOCUMENTS

JP      63-248225 A   10/1988
JP       8-97733 A    4/1996
(Continued)

OTHER PUBLICATIONS

PCT/ISA/210-International Search Report mailed on Nov. 22, 2011, issued in PCT/JP2011/074433.

*Primary Examiner* — Wesley Kim
*Assistant Examiner* — Md Talukder
(74) *Attorney, Agent, or Firm* — Birch, Stewart, Kolasch & Birch, LLP

(57) ABSTRACT

In a wireless communication device (10), adjustment means (matching controlling means (152)) changes a reactance of a matching section (17), determination means (calculation means (151), matching controlling means (152)) determines whether a resonance frequency of an antenna (11) exists on a side higher than or lower than the operation frequency of the antenna (11) on the basis of a change in an intensity of a signal, which change is caused by a change in the reactance and is detected by a signal intensity detection section (14), and the adjustment means adjusts the reactance so that the resonance frequency is closer to the operation frequency on the basis of a result of determination of the determination means.

17 Claims, 10 Drawing Sheets

(56) References Cited

U.S. PATENT DOCUMENTS

| | | | |
|---|---|---|---|
| 2002/0160722 A1* | 10/2002 | Terranova et al. | 455/73 |
| 2006/0094458 A1* | 5/2006 | Kitaji | 455/522 |
| 2007/0080867 A1* | 4/2007 | Son et al. | 343/700 MS |
| 2007/0210899 A1* | 9/2007 | Kato et al. | 340/310.15 |
| 2007/0232249 A1* | 10/2007 | Kwon et al. | 455/121 |
| 2007/0285255 A1* | 12/2007 | Tsushima et al. | 340/572.7 |
| 2008/0305750 A1* | 12/2008 | Alon et al. | 455/77 |
| 2009/0275293 A1* | 11/2009 | Ida | 455/73 |
| 2010/0081378 A1 | 4/2010 | Kawamura | |
| 2010/0207823 A1* | 8/2010 | Sakata et al. | 343/702 |
| 2010/0227557 A1* | 9/2010 | Won et al. | 455/41.2 |
| 2010/0285836 A1* | 11/2010 | Horihata et al. | 455/552.1 |
| 2011/0287732 A1* | 11/2011 | Kakuya et al. | 455/334 |
| 2012/0063368 A1* | 3/2012 | Boyle | 370/277 |
| 2012/0157026 A1* | 6/2012 | McKinzie et al. | 455/193.1 |
| 2013/0225098 A1* | 8/2013 | Ikehata | 455/77 |

FOREIGN PATENT DOCUMENTS

| | | |
|---|---|---|
| JP | 11-136157 A | 5/1999 |
| JP | 2005-303651 A | 10/2005 |
| JP | 2006-129358 A | 5/2006 |
| JP | 2006-314012 A | 11/2006 |
| JP | 2007-163415 A | 6/2007 |
| JP | 2007-282238 A | 10/2007 |
| JP | 2008-148148 A | 6/2008 |
| WO | 2006/080304 A1 | 8/2006 |

* cited by examiner

FIG. 5

(1) Transmission Level Is 10 / (Reflected Wave / Progressive Wave) Is 90%

| | Power | Reflected Wave / Progressive Wave |
|---|---|---|
| Transmission Level | 10 | |
| Progressive Wave | 10 | 100% |
| Reflected Wave Level | 9 | 90% |
| Radiation From Antenna | 1 | 10% |

(2) Transmission Level Is Increased To 20 / (Reflected Wave / Progressive Wave) Is Improved To 80% Because Matching Is Changed

| | Power | Reflected Wave / Progressive Wave |
|---|---|---|
| Transmission Level | 20 | |
| Progressive Wave | 20 | 100% |
| Reflected Wave Level | 16 | 80% |
| Radiation From Antenna | 4 | 20% |

(3) Transmission Level Is Increased To 30 / (Reflected Wave / Progressive Wave) Is Improved To 70% Because Matching Is Changed

| | Power | Reflected Wave / Progressive Wave |
|---|---|---|
| Transmission Level | 30 | |
| Progressive Wave | 30 | 100% |
| Reflected Wave Level | 21 | 70% |
| Radiation From Antenna | 9 | 20% |

(4) Transmission Level Is Increased To 40 / (Reflected Wave / Progressive Wave) Is Improved To 60% Because Matching Is Changed

| | Power | Reflected Wave / Progressive Wave |
|---|---|---|
| Transmission Level | 40 | |
| Progressive Wave | 40 | 100% |
| Reflected Wave Level | 24 | 60% |
| Radiation From Antenna | 16 | 40% |

(1) Transmission Level Is 10 / Reflected Wave Level Is 9

| | Power | Reflected Wave / Progressive Wave |
|---|---|---|
| Transmission Level | 10 | |
| Progressive Wave | 10 | 100% |
| Reflected Wave Level | 9 | 90% |
| Radiation From Antenna | 1 | 10% |

(2) Reflected Wave Level Is Decreased To 8 Because Matching Is Changed. Antenna Radiation Efficiency Is Increased.

| | Power | Reflected Wave / Progressive Wave |
|---|---|---|
| Transmission Level | 10 | |
| Progressive Wave | 10 | 100% |
| Reflected Wave Level | 8 | 80% |
| Radiation From Antenna | 2 | 20% |

(3) Reflected Wave Level Is Decreased To 7 Because Matching Is Changed. Antenna Radiation Efficiency Is Increased.

| | Power | Reflected Wave / Progressive Wave |
|---|---|---|
| Transmission Level | 10 | |
| Progressive Wave | 10 | 100% |
| Reflected Wave Level | 7 | 70% |
| Radiation From Antenna | 3 | 20% |

(4) Reflected Wave Level Is Decreased To 6 Because Matching Is Changed. Antenna Radiation Efficiency Is Increased.

| | Power | Reflected Wave / Progressive Wave |
|---|---|---|
| Transmission Level | 10 | |
| Progressive Wave | 10 | 100% |
| Reflected Wave Level | 6 | 60% |
| Radiation From Antenna | 4 | 40% |

(b)

(1) Transmission Level Is 10 / Reflected Wave Level Is 9

| | Power | Reflected Wave / Progressive Wave |
|---|---|---|
| Transmission Level | 10 | |
| Progressive Wave | 10 | 100% |
| Reflected Wave Level | 9 | 90% |
| Radiation From Antenna | 1 | 10% |

(2) Transmission Level Is Increased To 20 / Reflected Wave Level Is Changed To 16 Because Matching Is Changed

| | Power | Reflected Wave / Progressive Wave |
|---|---|---|
| Transmission Level | 20 | |
| Progressive Wave | 20 | 100% |
| Reflected Wave Level | 16 | 80% |
| Radiation From Antenna | 4 | 20% |

(3) Transmission Level Is Increased To 30 / Reflected Wave Level Is Changed To 21 Because Matching Is Changed

| | Power | Reflected Wave / Progressive Wave |
|---|---|---|
| Transmission Level | 30 | |
| Progressive Wave | 30 | 100% |
| Reflected Wave Level | 21 | 70% |
| Radiation From Antenna | 9 | 20% |

(4) Transmission Level Is Increased To 40 / Reflected Wave Level Is Changed To 24 Because Matching Is Changed

| | Power | Reflected Wave / Progressive Wave |
|---|---|---|
| Transmission Level | 40 | |
| Progressive Wave | 40 | 100% |
| Reflected Wave Level | 24 | 60% |
| Radiation From Antenna | 16 | 40% |

WIRELESS COMMUNICATION DEVICE, METHOD FOR CONTROLLING WIRELESS COMMUNICATION DEVICE, PROGRAM, AND STORAGE MEDIUM

TECHNICAL FIELD

The present invention relates to a technique of a wireless communication, in particular, to a wireless communication device having a matching circuit whose reactance is variable.

BACKGROUND ART

In recent years, portable wireless terminals such as mobile phone terminals have been widely used. When such a mobile phone terminal is not used, an antenna provided inside the mobile phone terminal is present in a free space away from a human body or in a bag. In a case where a user uses the mobile phone terminal to perform voice communication, the antenna is present in the vicinity of the user's head. In a case where the mobile phone terminal is used to perform data communication, the antenna is present in the vicinity of a palm of a hand. In a case where the mobile phone terminal is charged, the antenna is present in some cases in the vicinity of a battery charger. Thus, a position of the antenna is changed in accordance with a usage status, and, in a case where the position of the antenna is changed, a load of the antenna is also changed by influences of a user's head, a user's hand, a battery charger, or the like. This deteriorates a property of wireless transmission and reception of a device.

In order to solve such a problem, there is proposed a technique for suppressing deterioration of the transmission and reception property (transmission and reception sensitivity) by adjusting a load value of a matching circuit.

For example, Patent Literature 1 discloses a method for adjusting a load value of a matching circuit with use of a portable wireless device such as that shown in FIG. 9. A portable wireless device 1 of FIG. 9 includes a matching circuit 102, a controlling section 105, and a storage section 106.

In a case where a controlling section 105 starts to control the matching circuit 102, the controlling section 105 examines initial load value information, stored in the storage section 106, on the basis of a signal intensity in a frequency band of a received signal detected by a signal intensity detection section 103, and, if the initial load value information for performing impedance matching is stored in the storage section 106, the controlling section 105 controls the matching circuit 102 so that the matching circuit 102 obtains a load value corresponding to the initial load value information. On the contrary, in a case where the initial load value information for performing impedance matching is not stored in the storage section 106, the controlling section 105 evolves the initial load value information with a genetic algorithm to thereby obtain matching load value information for performing impedance matching, and controls the matching circuit 102 so that the matching circuit 102 obtains a load value corresponding to the matching load value information thus obtained.

Note that a technique for adjusting a load value of a matching circuit is disclosed in, for example, Patent Literature 2.

CITATION LIST

Patent Literatures

Patent Literature 1
Pamphlet of International Publication WO 2006/080304

Patent Literature 2
Japanese Patent Application Publication, Tokukai, No. 2007-163415 A (Publication date: Jun. 28, 2007)

SUMMARY OF INVENTION

Technical Problem

However, in a case of using the technique of Patent Literature 1, a malfunction, such as cut-off of call connection during communication, occurs in some cases. In a case of the technique of Patent Literature 1, the controlling section 105 examines all pieces of initial load value information stored in the storage section 106 and determines whether or not initial load value information for performing impedance matching is stored in the storage section 106. The initial load value information stored in the storage section 106 contains wrong initial load value information which causes deterioration of the transmission and reception property.

FIG. 10 shows an example relationship among a resonance frequency f0 of an antenna, a frequency Tx of a transmitted signal, and a frequency Rx of a received signal. In graphs of FIG. 10, a vertical axis represents a signal intensity and a transverse axis represents a frequency. The resonance frequency f0 of the antenna is usually adjusted to a band for use in communication. As shown in FIG. 10, the transmission and reception property is improved as each of the frequencies Tx and Rx are closer to the resonance frequency f0.

For example, as shown in (a) of FIG. 10, in a case where the resonance frequency f0 is on a left side of an intermediate value of the frequencies Tx and Rx, i.e., in a case where the resonance frequency f0 is lowered, it is necessary to raise the resonance frequency fQ in order to improve the transmission and reception property. In a status of (a) of FIG. 10, in a case where the storage section 106 stores both initial load value information for causing the resonance frequency fQ to be lowered and initial load value information for raising the resonance frequency f0, all pieces of initial load value information are examined in the technique of Patent Literature 1, the controlling section 105 examines the initial load value information for causing the resonance frequency f0 to be lowered. Therefore, as shown in (b) of FIG. 10, the resonance frequency f0 is further lowered, that is, the transmission and reception property is further deteriorated, and, in a worst case, call connection is cut off.

As described above, in a case where initial load value information stored in the storage section 106 contains wrong initial load value information which causes deterioration of the transmission and reception property, the controlling section 105 also examine the wrong initial load value information. Therefore, there is problems in that the transmission and reception property (transmission and reception performance) of the portable wireless device 1 is remarkably deteriorated during such examination of the initial load value information and call connection of the portable wireless device 1 is cut off.

In view of the above problems, an object of the present invention is to achieve a wireless communication device which can maintain a satisfactory communication status.

In the technique of Patent Literature 1, the controlling section 105 selects initial load value information for performing impedance matching from the initial load value information stored in the storage section 106, and controls the matching circuit 102. After that, the controlling section 105 further controls the matching circuit 102 to thereby perform impedance matching. In a case where the controlling section 105 performs impedance matching on a receiving side, the controlling section 105 controls the matching circuit 102 depending on whether or not a received power is appropriate, meanwhile, in a case where the controlling section 105 performs impedance matching on a transmitting side, the controlling section 105 controls the matching circuit 102 so that a transmitted signal has a smaller reflected voltage.

However, in a case where a signal intensity (transmission level) of the transmitted signal is variable, the reflected voltage does not always become smallest when the transmission and reception performance is improved.

FIG. 11 shows example relationships between (A) change in intensity (reflected wave level) of a reflected wave obtained by a reflected voltage of a transmitted signal, which change is caused by control of the matching circuit 102 (change in matching) and (B) a ratio (reflected wave/progressive wave) of an intensity of a reflected wave to a progressive wave toward an antenna. In FIG. 11, the example relationship in a case where a transmission level is changed and the example relationship in a case where a transmission level is not changed are shown. The transmission level can be indicated by a sum total of a reflected wave level, an intensity of a signal radiated from the antenna (radiation from the antenna), and a loss of a signal intensity. FIG. 11 exemplifies a case where the loss of the signal intensity is 0(zero).

For example, as shown in (a) of FIG. 11, in a case where the transmission level is not changed from 10 and (1) the reflected wave level is 9, it is found that a signal radiated from the antenna is 10% of the transmitted signal on the basis of reflected wave/progressive wave. Next, in a case where (2) the reflected wave level is decreased from the reflected wave level of the status (1) to 8 because of change in matching, a signal radiated from the antenna is increased to 20% of the transmitted signal. From this, it is found that radiation efficiency of the antenna is improved. Further, (3) in a case where the reflected wave level is decreased to 7 because of change in matching, a signal radiated from the antenna is increased to 30% of the transmitted signal. Furthermore, (4) in a case where the reflected wave level is decreased to 6 because of change in matching, a signal radiated from the antenna is increased to 40% of the transmitted signal.

The controlling section 105 controls the matching circuit 102 to have a small reflected voltage, and, in the case of (a) of FIG. 11, the controlling section 105 selects the status (4) having the smallest reflection level and controls the matching circuit 102. In this case, the radiation efficiency of the antenna is 40%, and the status (4) is therefore the best of the four statuses (1) through (4). That is, the status (4) has the highest transmission and reception performance.

(b) of FIG. 11 shows an example relationship in a case where a transmission level is changed from 10, which relationship is between (A) a change in reflection level and (B) reflected wave/progressive wave. As shown in (b) of FIG. 11, (1) in a case where the transmission level is 10 and the reflected wave level is 9 which means 90%, a signal radiated from the antenna is 10% of the transmitted signal. Next, (2) in a case where the transmission level is increased from the transmission level in the status (1) to 20 and the reflected wave level becomes 16 which means 80% because of change in matching, a signal radiated from the antenna is increased to 20% of the transmitted signal. Further, (3) in a case where the transmission level is increased to 30, the reflected wave level becomes 21 which means 70% because of change in matching, a signal radiated from the antenna is increased to 30% of the transmitted signal. Furthermore, (4) in a case where the transmission level is increased to 40, the reflected wave level is 24 which means 60% because of change in matching, a signal radiated from the antenna is increased to 40% of the transmitted signal.

In the statuses (1) through (4), the controlling section 105 selects the status (1) having the smallest reflection level, and controls the matching circuit 102. In this case, the radiation efficiency of the antenna is 10%, and the status (1) is therefore the worst of the statuses (1) through (4). That is, the controlling section 105 selects a status of the lowest transmission and reception performance, and controls the matching circuit 102.

In an actual environment, a signal intensity (reception level) of a received signal constantly varies due to an influence of fading. Further, in a case where a portable wireless device receives a request for increasing a transmission level (transmission level improving request) from a base station, the portable wireless device cannot withhold the request. Therefore, in such a case, a transmission level varies.

Thus, in an actual environment, the reception level and the transmission level vary due to another reason other than change in matching, so that the wireless communication device (portable wireless device 1) of Patent Literature 1 has a problem in that the transmission and reception property (transmission and reception performance) is in some cases deteriorated.

Solution to Problem

In order to solve the above problems, a wireless communication device of the present invention includes: an antenna; a wireless controlling section for processing a signal that the antenna transmits and receives; a matching section which is connected between the antenna and the wireless controlling section and has a variable reactance; signal intensity detection means for detecting an intensity of the signal passed between the antenna and the wireless controlling section; adjustment means for changing the variable reactance of the matching section; and determination means for determining whether a resonance frequency of the antenna exists on a side higher than or lower than an operation frequency of the antenna on the basis of a change in the intensity, which change is caused by a change in the variable reactance and is detected by the signal intensity detection means, the adjustment means adjusting the variable reactance so that the resonance frequency is closer to the operation frequency on the basis of a result of determination of the determination means.

According to the configuration, since the matching section is connected between the antenna and the wireless controlling section and has a variable reactance, it is possible to adjust the resonance frequency of the antenna by adjusting the reactance. For example, it is possible to raise the resonance frequency by changing the reactance of the matching section to the negative direction (by decreasing the inductance, or by decreasing the capacitance). Further, it is possible to lower the resonance frequency by changing the reactance of the matching section to the positive direction (by increasing the inductance, or by increasing capacitance).

The adjustment means changes the reactance of the matching section, and the determination means determines which of the resonance frequency of the antenna and the operation frequency is higher on the basis of the change in the intensity caused by the change in the reactance. For example, in a case where the adjustment means changes the reactance of the matching section, the determination means can determine that the resonance frequency of the antenna has become closer to the operation frequency if the intensity of the signal that was transmitted or received has been increased, and the determination means can determine that the resonance frequency of the antenna is far away from the operation frequency if the intensity of the signal that is transmitted or received is decreased. In a case where the reactance of the matching section is changed to the negative direction and the resonance frequency of the antenna is therefore raised, the determination means can determine that, if the determination means determines that the resonance frequency of the antenna is closer to the operation frequency, the resonance frequency of the antenna exists on the side lower than the operation frequency. On the contrary, in a case where the reactance of the matching section is changed to the negative direction, the determination means can determine that, if the determination means determines that the resonance frequency of the antenna is far away from the operation frequency, the resonance frequency of the antenna exists on the side higher than the operation frequency. Further, in a case where the reactance of the matching section is changed to the positive direction and the resonance frequency of the antenna is therefore lowered, the determination means determines that, if the determination means determines that the resonance frequency of the antenna is closer to the operation frequency, the resonance frequency of the antenna exists on the side higher than the operation frequency. On the contrary, in a case where the reactance of the matching section is changed to the positive direction, the determination means determines that, if the determination means determines that the resonance frequency of the antenna is far away from the operation frequency, the resonance frequency of the antenna exists on the side lower than the operation frequency.

The adjustment means adjusts the reactance of the matching section so that the resonance frequency of the antenna is closer to the operation frequency in accordance with a result of determination of the determination means. Thus, the resonance frequency of the antenna is successfully caused to be closer to the operation frequency, and therefore, the antenna characteristic can be improved. For example, in a case where it is determined that the resonance frequency of the antenna exists on the side higher than the operation frequency, the resonance frequency of the antenna may be lowered by changing the reactance of the matching section to the positive direction, meanwhile, in a case where it is determined that the resonance frequency of the antenna exists on the side lower than the operation frequency, the resonance frequency of the antenna may be raised by changing the reactance of the matching section to the negative direction.

According to the configuration as described above, in order to improve the antenna characteristic, the resonance frequency can be adjusted after whether to raise or lower the resonance frequency is determined. Therefore, unlike a case where the resonance frequency is adjusted without performing such determination, the call connection is not cut off due to remarkable deterioration of the antenna characteristic for a short time, and a satisfactory communication status can be maintained.

Further, in order to solve the above problems, a controlling method of a wireless communication device of the present invention, including (i) an antenna, (ii) a wireless controlling section for processing a signal that the antenna transmits and receives, and (iii) a matching section which is connected between the antenna and the wireless controlling section and has a variable reactance, the method comprising: a signal intensity detecting step of detecting an intensity of the signal passed between the antenna and the wireless controlling section; a first adjustment step of changing a reactance of the matching section; a determination step of determining whether a resonance frequency of the antenna exists on a side higher than or lower than an operation frequency of the antenna on the basis of a change in the intensity, which change is caused by a change in the reactance and is detected by the signal intensity detection means; and a second adjustment step for adjusting the reactance so that the resonance frequency is closer to the operation frequency on the basis of a result of determination in the determination step.

The above method has an effect same as that of the wireless communication device of the present invention.

For a fuller understanding of the nature and advantages of the invention, reference should be made to the ensuing detailed description taken in conjunction with the accompanying drawings.

Advantageous Effects of Invention

According to the present invention, in order to improve the antenna characteristic, the resonance frequency can be adjusted after whether to raise or lower the resonance frequency is determined. Therefore, unlike a case where the resonance frequency is adjusted without performing such determination, the call connection is not cut off due to remarkable deterioration of the antenna characteristic for a short time, and a satisfactory communication status can be maintained.

BRIEF DESCRIPTION OF DRAWINGS

FIG. 5 is a view showing an example relationship between a change in reflection level in accordance with control of the matching circuit of FIG. 1 and a ratio of an intensity of a reflected wave to a progressive wave toward an antenna of a transmitted signal.

FIG. 11 is a view showing an example relationship between a change in reflection level in accordance with control of a matching circuit and a ratio of an intensity of a reflected wave to a progressive wave toward an antenna of a transmitted signal. (a) shows a ratio of an intensity of a reflected wave to a progressive wave toward an antenna of a transmitted signal in a case where the transmission level is not varied, (b) shows a ratio of an intensity of a reflected wave to a progressive wave toward an antenna of a transmitted signal in a case where the transmission level is varied.

DESCRIPTION OF EMBODIMENTS

The following description will specifically discuss embodiments of the present invention with reference to drawings. Note that, in the following description, preferable various limitations are applied to the present invention, however, a technical scope of the present invention is not limited to the following Examples and the drawings.

<Embodiment 1>

An embodiment of a wireless communication device of the present invention will be described below with reference to FIG. 1 through FIG. 5.

[Configuration of Wireless Communication Device]

Figure 1:
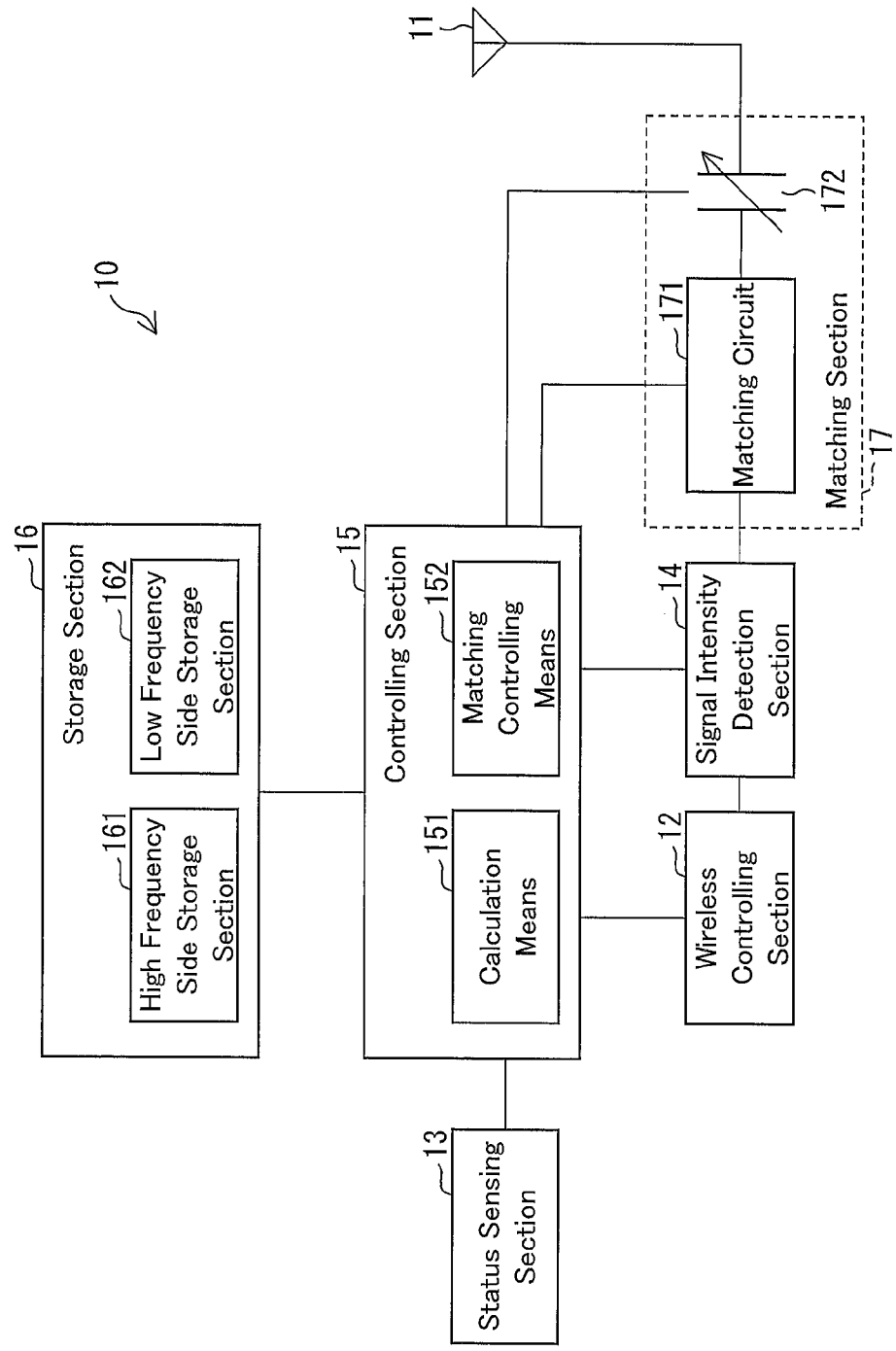
FIG. 1 is a block diagram showing an internal configuration of a wireless communication device in an embodiment of the present invention.

A configuration of a wireless communication device 10 in Embodiment 1 will be described below with reference to FIG. 1. FIG. 1 is a block diagram showing an internal configuration of the wireless communication device 10.

As shown in FIG. 1, the wireless communication device 10 includes an antenna 11, a wireless controlling section 12, a status sensing section (status sensing means) 13, a signal intensity detection section (signal intensity detection means) 14, a controlling section 15, a storage section 16, and a matching section 17.

The controlling section 15 includes calculation means (determination means) 151 and matching controlling means (determination means, adjustment means) 152. The matching section 17 includes a matching circuit (first matching circuit) 171 and a variable capacitor (variable element) 172.

The wireless controlling section 12 processes a signal that the antenna 11 transmits and receives. Specifically, the wireless controlling section 12 carries out down-conversion, demodulation, and D-A (Digital-Analog) conversion with respect to a received signal thus received. Further, the wireless controlling section 12 carries out A-D (Analog-Digital) conversion, modulation, and up-conversion with respect to a transmitted signal.

Note that the wireless controlling section 12 is, for example, an RF IC (radio frequency integrated circuit).

The status sensing section 13 senses a change in status of the wireless communication device 10. The status sensing section 13 is, for example, a sensor of a battery charger which senses start of charging, a proximity sensor which senses proximity of an external object such as a user's face, an extension sensor of a sliding-type wireless communication device, and an opening and closing sensor of a clamshell-type wireless communication device. The status sensing section 13 notifies the controlling section 15 of the change in the status thus sensed.

Note, however, that the status sensing section 13 is not limited thereto, and there may be used, for example, a button input sensor which senses push of a telephone communication button for receiving a start instruction of voice communication and a data communication sensor which senses that a user transmits data and/or receives data.

The status sensing section 13 may be configured to sense a status of the wireless communication device 10 on the basis of a change in signal intensity detected by the signal intensity detection section 14.

The signal intensity detection section 14 detects an intensity of a signal passed between the antenna 11 and the wireless controlling section 12. Specifically, the signal intensity detection section 14 detects a signal intensity (transmission level) of a transmitted signal by detecting a progressive wave of a transmitted signal transmitted via the antenna 11, and an intensity (level) of a reflected wave of the transmitted signal reflected on the antenna 11. A signal intensity detection section supplies a progressive wave thus detected and a reflected wave to the controlling section 15. Note that the signal intensity detection section 14 is, for example, a coupler and a wave detection IC.

The controlling section 15 collectively controls each section of the wireless communication device 10. The controlling section 15 includes a calculation means 151 and a matching controlling means 152.

The calculation means 151 calculates a ratio (reflected wave/progressive wave) of an intensity of a reflected wave to a progressive wave toward an antenna with use of the progressive wave and the reflected wave detected by the signal intensity detection section 14. The calculation means 151 causes the reflected wave/progressive wave thus calculated to be stored in the storage section 16.

The matching controlling means 152 controls the matching section 17. Specifically, the matching controlling means 152 changes a reactance of the matching section 17 and determines, in accordance with the reflected wave/progressive wave calculated by the calculation means 151, whether a resonance frequency of the antenna 11 exists on a side higher than or lower than an operation frequency of the antenna 11.

The matching controlling means 152 further adjusts the reactance of the matching section 17 on the basis of a result of this determination so that the resonance frequency is closer to the operation frequency.

The operation frequency is a frequency for use in transmission via the antenna 11.

Further, the controlling section 15 is, for example, a base band IC.

The storage section 16 includes: a high frequency side storage section (first storage section) 161 which stores a plurality of high frequency side matching adjustment values (first matching adjustment values), each of which defines a reactance to be used when the matching controlling means 152 controls a resonance frequency f0 of the antenna 11 to be raised; and a low frequency side storage section (second storage section) 162 which stores a plurality of low frequency side matching adjustment values (second matching adjustment values), each of which defines a reactance to be used when the matching controlling means 152 controls the resonance frequency f0 of the antenna 11 to be raised.

The storage section 16 stores reflected wave/progressive wave calculated by the calculation means 151. Note that the storage section 16 is, for example, RAM (random access memory).

The matching section 17 is connected between the antenna 11 and the wireless controlling section 12, and has a variable reactance. The matching section 17 includes a matching circuit 171 and a variable capacitor 172. The matching circuit 171 switches a reactance value in accordance with a signal transmitted from the matching controlling means 152 by adjusting a resonance frequency of an antenna so that the resonance frequency is closer to an operation frequency. The variable capacitor 172 is connected in series to the matching circuit 171 and is used to detect a location of the resonance frequency with use of a reactance changed by a signal transmitted from the matching controlling means 152.

[Flow of Adjustment of Resonance Frequency]

Figure 2:
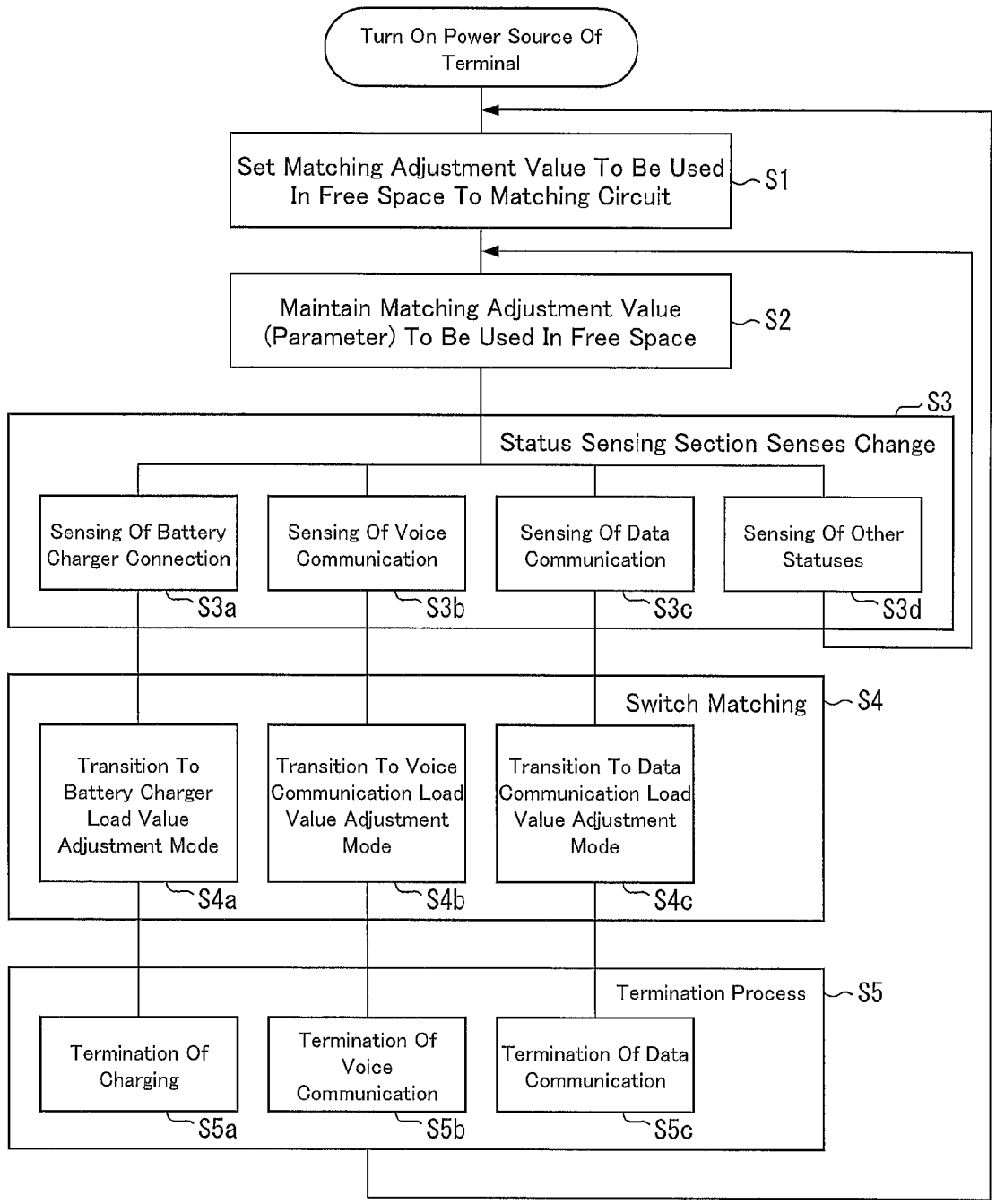
FIG. 2 is a flowchart showing a flow of adjustment of a resonance frequency in the wireless communication device of FIG. 1.
Figure 3:
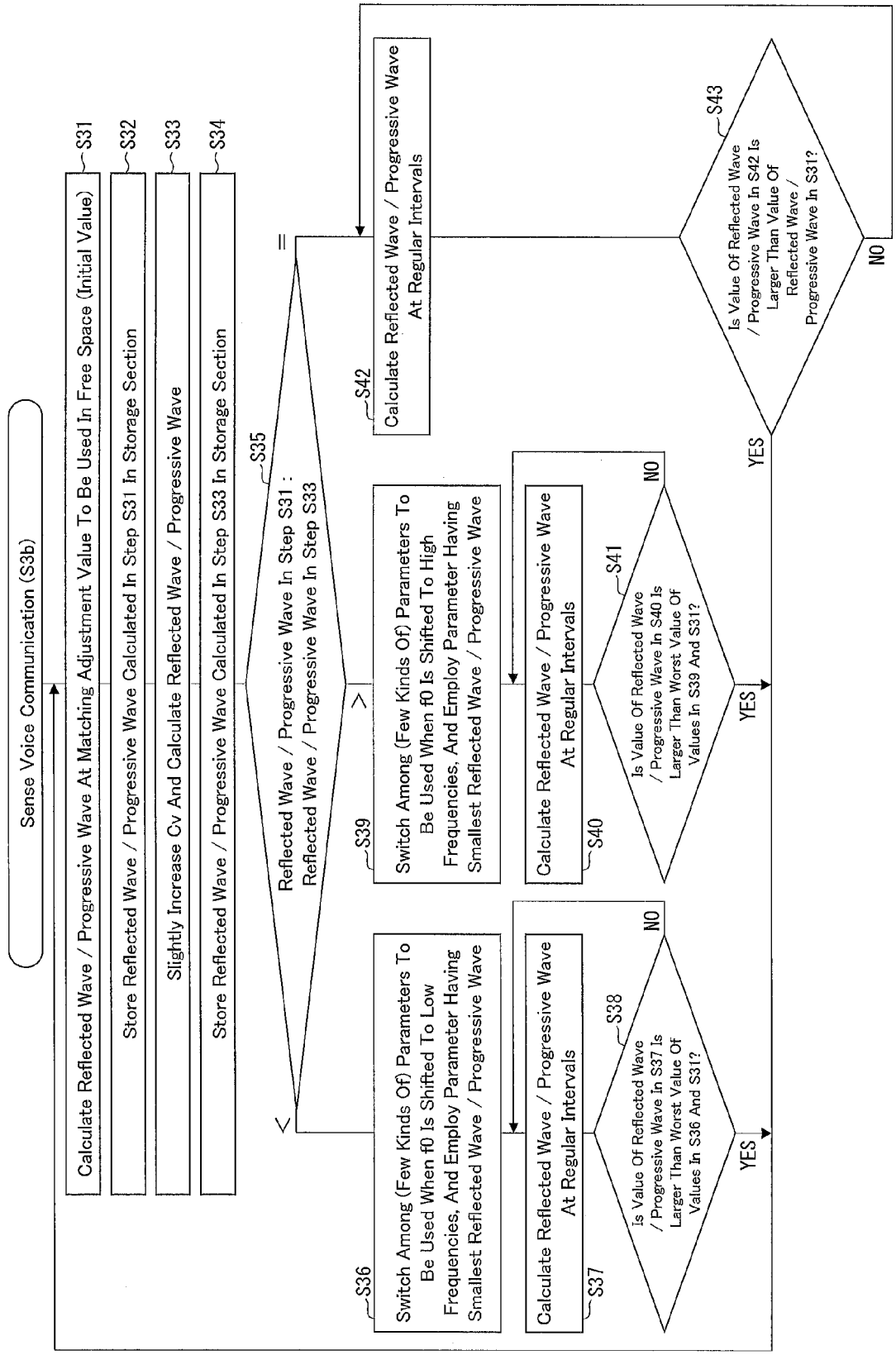
FIG. 3 is a flowchart showing a specific flow of adjustment of a resonance frequency in a case where a status of the wireless communication device of FIG. 1 is detected.

The following description will discuss, with reference to FIG. 2 and FIG. 3, a flow of adjustment of a resonance frequency in the wireless communication device 10.

FIG. 2 is a flowchart showing a flow of adjustment of a resonance frequency in the wireless communication device 10.

When a power source of the wireless communication device 10 is turned ON, the matching controlling means 152 sets a matching adjustment value to be used in a free space to the matching circuit 171. The matching adjustment value to be used in a free space is determined as an initial value (step S1; hereinafter, referred to simply as S1).

The matching circuit 171 maintains a matching adjustment value (initial value) to be used in a free space (S2), and the status sensing section 13 senses changes in status of the wireless communication device 10 (S3). Then the matching controlling means 152 determines whether the resonance frequency f0 of the antenna 11 in each status exists on the side higher than or lower than the operation frequency of the antenna 11, and adjusts the reactance (switches matching) (S4).

In this embodiment, the changes in status of the wireless communication device 10 sensed by the status sensing section 13 means start of charging from a battery charger (battery charger connection sensing), start of voice communication (voice communication sensing), and start of data communication (data communication sensing) which indicates that data is transmitted and/or received after a user boots an application for writing an e-mail and/or boots a browser.

Note that the change in the status as the start of voice communication, which is sensed by the status sensing section 13, may be proximity of a user's face to a proximity sensor or push of a telephone communication button. In Embodiment 1, such proximity of a user's face to a proximity sensor is determined as the start of the voice communication. The wireless communication device 10 is therefore influenced by a user's face or hand, so that a status of the wireless communication device 10 after matching is switched is more stable.

That is, in a case where the status sensing section 13 senses connection of a battery charger (S3a), the matching controlling means 152 determines, while charging is being performed, whether the resonance frequency f0 of the antenna 11 exists on the side higher than or lower than the operation frequency of the antenna 11, and switches matching (transition to a battery charger load value adjustment mode, S4a). In a case where the status sensing section 13 senses voice communication (S3b), the matching controlling means 152 determines, while the voice communication is being performed, whether the resonance frequency f0 of the antenna 11 exists on the side higher than or lower than the operation frequency of the antenna 11, and switches matching (transition to a voice communication load value adjustment mode, S4b). In a case where the status sensing section 13 senses data communication (S3c), the matching controlling means 152 determines, while data communication is being performed, whether the resonance frequency f0 of the antenna 11 exists on the side higher than or lower than the operation frequency of the antenna 11, and switches matching (transition to a data communication load value adjustment mode, S4c).

In a case where the status sensing section 13 senses other statuses (S3d), the processing proceeds to S2.

After that, a termination process such as termination of charging (S5a), termination of voice communication (S5b), or termination of data communication (S5c) is carried out (S5), and then the processing proceeds to S1 again, the matching controlling means 152 sets the matching adjustment value to be used in a free space to the matching circuit 171.

Note that the changes in status of the wireless communication device 10 sensed by the status sensing section 13 are not limited thereto, and, for example, opening/closing of the wireless communication device 10 may be sensed by the status sensing section 13 as the change in the status.

Note that, in a flowchart of FIG. 2, in a case where a power source of the wireless communication device 10 is turned OFF, an adjustment process of the resonance frequency is terminated.

Figure 4:
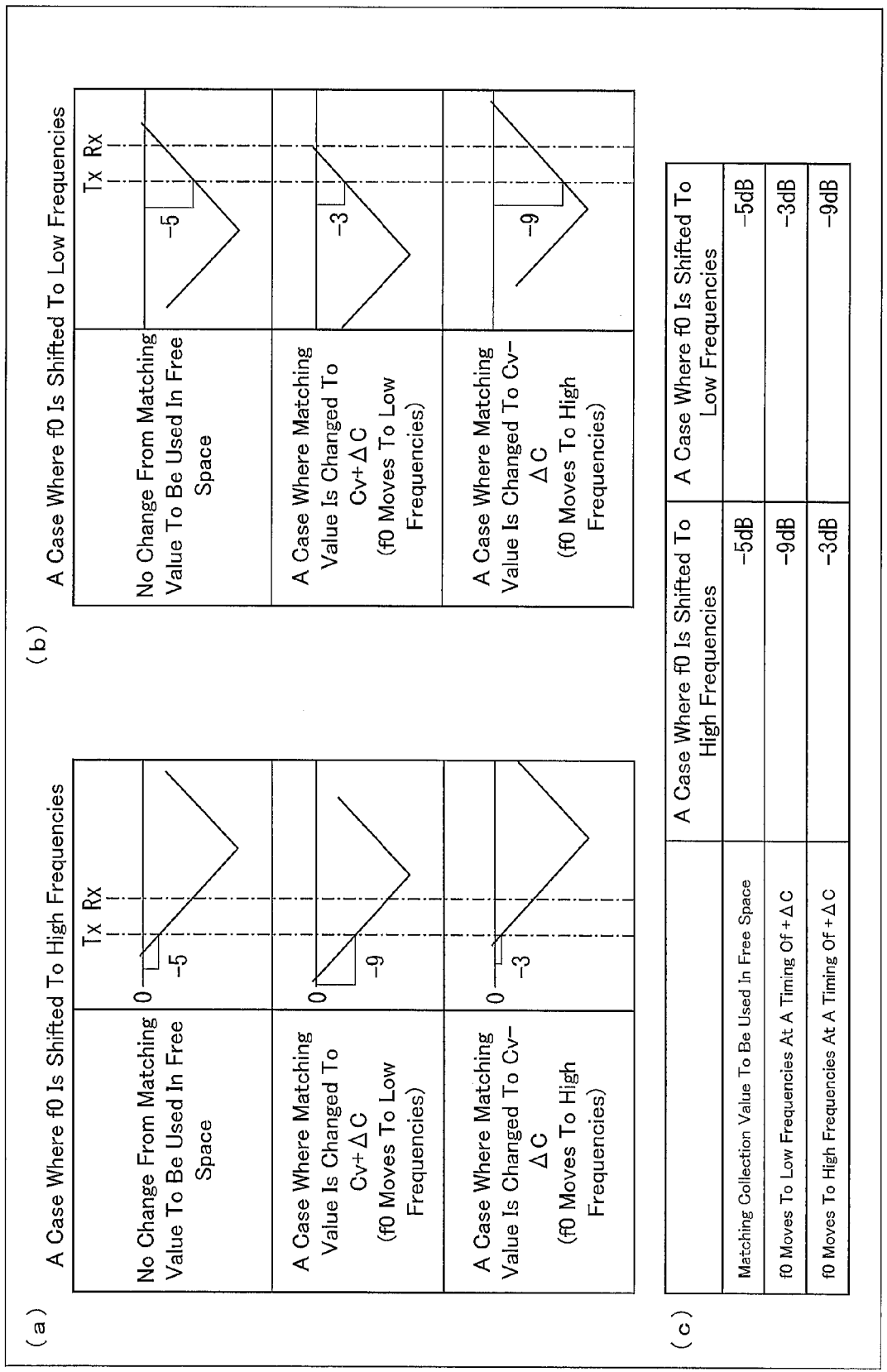
FIG. 4 is a view showing an example ratio in a case where a resonance frequency when a matching switching process is started is lowered or raised from a resonance frequency in a free space, the ratio being of an intensity of a reflected wave to a progressive wave toward an antenna of a transmitted signal in a frequency band of a transmitted signal obtained when matching controlling means changes a reactance of a variable element. (a) shows a ratio of an intensity of a reflected wave to a progressive wave toward an antenna of a transmitted signal in a case where a resonance frequency is raised, (b) shows a ratio of an intensity of a reflected wave to a progressive wave toward an antenna of a transmitted signal in a case where a resonance frequency is lowered, and (c) shows results of (a) and (b).

The following description will discuss switching of matching in detail with reference to FIG. 3 and FIG. 4. FIG. 3 is a flowchart showing a detailed flow of the matching switching process (S4b) in the voice communication load value adjustment mode.

For example, FIG. 3 shows a process of checking whether the resonance frequency f0 after the voice communication is sensed (S3b) exists on (is adjusted to) the side higher than or lower than a resonance frequency (operation frequency) in a free space, and switching a matching adjustment value for adjusting the resonance frequency f0 in an opposite direction of a direction in which the resonance frequency f0 has been lowered or raised.

The calculation means 151 calculates reflected wave/progressive wave with use of a matching adjustment value (initial value) to be used in a free space, which matching adjustment value has been set to the matching circuit 171 by the matching controlling means 152 in S1 (S31), and cause a result of calculation to be stored in the storage section 16 (S32).

Then, the matching controlling means 152 changes a reactance of the variable capacitor 172 in a slightly positive direction. That is, a capacitance Cv of the variable capacitor 172 is slightly increased (+ΔC). After the matching controlling means 152 changes the reactance of the variable capacitor 172 in the positive direction, the calculation means 151 calculates a reflected wave/progressive wave on the basis of the progressive wave and the intensity of the reflected wave detected by the signal intensity detection section 14 (S33), and causes the reflected wave/progressive wave to be stored in the storage section 16 (S34). Note that Embodiment 1 will discuss an example where the reactance of the variable capacitor 172 is changed in the positive direction, i.e., an example where the capacitance Cv of the variable capacitor 172 is slightly increased, however, the matching controlling means 152 may change the reactance of the variable capacitor 172 in a negative direction, i.e., may slightly decrease (−ΔC) the capacitance Cv.

With reference to FIG. 4, the following description will discuss, on the basis of a return-loss, whether the resonance frequency f0 is raised or lowered by changing the capacitance Cv. Note that a person skilled in the art easily understand that a similar result can be obtained by using a return-loss instead of using a value of the reflected wave/progressive wave. That is, the calculation means 151 may calculate a return-loss instead of a value of the reflected wave/progressive wave, and the matching controlling means 152 may use a return-loss instead of the value of the reflected wave/progressive wave.

FIG. 4 shows an example return-loss of a transmitted signal in a frequency band Tx of the transmitted signal when the resonance frequency f0 is adjusted and the variable capacitor 172 therefore changes the capacitance Cv, in a case where the resonance frequency f0 when the matching switching process (S4) is started exists on (is adjusted to) the side higher than or lower than the resonance frequency (operation frequency) in a free space. A transverse axis of each graph indicates a frequency, and a vertical axis of each graph indicates a value of return-loss.

(a) of FIG. 4 shows a return-loss of a transmitted signal in the frequency band Tx of the transmitted signal in a case where the resonance frequency f0 is adjusted to the side higher than an operation frequency. (1) In a case where the matching adjustment value is unchanged from the matching adjustment value to be used in a free space, a return-loss in the frequency band Tx is approximately −5.0 dB. (2) In a case where the capacitance Cv of the variable capacitor 172 is slightly increased (+ΔC) from the capacitance Cv in a state of (1), the resonance frequency f0 is lowered, a return-loss in the frequency band Tx is approximately −9.0 dB. (3) In a case where the capacitance Cv of the variable capacitor 172 is slightly decreased (−ΔC) from the capacitance Cv in the state of (1), the resonance frequency f0 is raised, a return-loss in the frequency band Tx is approximately −3.0 dB.

(b) of FIG. 4 shows a return-loss of a transmitted signal in the frequency band Tx of the transmitted signal in a case where the resonance frequency f0 is adjusted to the side lower than the operation frequency. (1) In a case where the matching adjustment value is unchanged from the matching adjustment value to be used in a free space, a return-loss in the frequency band Tx is approximately −5.0 dB. (2) In a case where the capacitance Cv of the variable capacitor 172 is slightly increased (+ΔC) from the capacitance Cv in a state of (1), the resonance frequency f0 is lowered, a return-loss in the frequency band Tx is approximately −3.0 dB. (3) in a case where the capacitance Cv of the variable capacitor 172 is slightly decreased (−ΔC) from the capacitance Cv in the state of (1), the resonance frequency f0 is raised, a return-loss in the frequency band Tx is approximately −9.0 dB.

(c) of FIG. 4 is a table showing results of (a) of FIG. 4 and (b) of FIG. 4. It can be said that a transmitted signal whose return-loss is small (reflected wave is low) is a signal having a high transmitting property. That is, it can be said that a signal has a high transmitting property when a value of a return-loss (reflected wave/progressive wave) in the frequency band Tx is smaller. As shown in (c) of FIG. 4, in a case where the resonance frequency f0 is raised, the variable capacitor 172 slightly increases the capacitance Cv, i.e., lowers the resonance frequency 10, the transmitting property is the best. In a case where the resonance frequency f0 is lowered and the variable capacitor 172 slightly decreases the capacitance Cv, i.e., the resonance frequency f0 is raised, the transmitting property is the best.

As is clear from this, it is necessary to adjust the resonance frequency f0 so that, when the capacitance Cv is reduced, a value of a return-loss becomes smaller.

After calculating the reflected wave/progressive wave in S33, the calculation means 151 returns the capacitance Cv of the variable capacitor 172 to an initial state. After S34 is terminated, the matching controlling means 152 compares the reflected wave/progressive wave calculated in S31 by the calculation means 151 with the reflected wave/progressive wave calculated in S33 by the calculation means 151 (S35).

In a case where a ratio of an intensity of a reflected wave to a progressive, wave toward the antenna 11 is increased, i.e., the reflected wave/progressive wave calculated in S31 is smaller than that calculated in S33, ("<" in S35), the matching controlling means 152 determines that the resonance frequency f0 exists on the side lower than the operation frequency. The matching controlling means 152 obtains a plurality of matching adjustment values (parameters) from the high frequency side storage section 161 of the storage section 16.

The matching controlling means 152 switches between the plurality of parameters of the matching circuit 171 thus obtained, and the calculation means 151 calculates reflected wave/progressive wave every time when a parameter is switched, and then, the calculation means 151 selects such a parameter that the reflected wave/progressive wave becomes the smallest. Among such calculated values of the reflected wave/progressive wave and a value calculated in S31, the largest value is set as the worst value. The matching controlling means 152 adjusts the matching circuit 171 by setting a value defined by a selected parameter to the matching circuit 171 (S36).

After that, the calculation means 151 calculates the reflected wave/progressive wave at regular intervals (S37), and compares a value of the reflected wave/progressive wave thus calculated and the worst value with each other (S38). In a case where the value of the reflected wave/progressive wave is larger than the worst value (Yes in S38), the processing proceeds to S31. In a case where the value of the reflected wave/progressive wave is smaller than the worst value (No in S38), the processing proceeds to S37, and selects again such a parameter that the reflected wave/progressive wave becomes the smallest.

In a case where a ratio of an intensity of a reflected wave to a progressive wave toward the antenna 11 is decreased, i.e., the reflected wave/progressive wave calculated in S31 is larger than that calculated in S33 (">" S35), the matching controlling means 152 determines that the resonance frequency f0 exists on the side higher than the operation frequency. The matching controlling means 152 obtains a plurality of matching adjustment values (parameters) from the low frequency side storage section 162 of the storage section 16.

The matching controlling means 152 switches the plurality of parameters of the matching circuit 171 thus obtained, and the calculation means 151 calculates reflected wave/progressive wave every time when a parameter is switched, and then, the calculation means 151 selects such a parameter that the reflected wave/progressive wave becomes the smallest. Among such calculated values of the reflected wave/progressive wave and a value calculated in S31, the largest value is set as the worst value. The matching controlling means 152 adjusts the matching circuit 171 by setting a value defined by a selected parameter to the matching circuit 171 (S39).

After that, the calculation means 151 calculates the reflected wave/progressive wave at regular intervals (S40), and compares a value of the reflected wave/progressive wave thus calculated and the worst value with each other (S41). In a case where the value of the reflected wave/progressive wave is larger than the worst value (Yes in S41), the processing proceeds to S31. In a case where the value of the reflected wave/progressive wave is smaller than the worst value (No in S41), the processing proceeds to S40, and selects again such a parameter that the reflected wave/progressive wave becomes the smallest.

In a case where the reflected wave/progressive wave calculated in S31 and the reflected wave/progressive wave calculated in S33 are identical to each other ("=" in S35), the calculation means 151 calculates the reflected wave/progressive wave at regular intervals (S42), and compares a value of a calculated reflected wave/progressive wave with the value of the reflected wave/progressive wave in a free space which is calculated in S31 (S43). In a case where the value of the reflected wave/progressive wave calculated in S42 is larger than the value of the reflected wave/progressive wave in the free space (Yes in S43), the processing proceeds to S31. In a case where the value of the reflected wave/progressive wave is smaller than the value of the reflected wave/progressive wave in the free space (No in S43), the processing proceeds to S42.

There has been described, in Embodiment 1, an example where the capacitance is slightly increased. However, even in a case where the matching controlling means 152 slightly decreases (−ΔC) the capacitance of the variable capacitor 172 in S33, the matching controlling means 152 only needs to make an opposite determination of the above determination in S35.

The matching controlling means 152 obtains a plurality of matching adjustment values (parameters) from the low frequency side storage section 162 of the storage section 16. The matching controlling means 152 further obtains, in S39, a plurality of matching adjustment values (parameters) from the high frequency side storage section 161 of the storage section 16.

Note that, in a case where the voice communication termination process (S5b) is carried out in a flowchart of FIG. 3, the processing is terminated.

Note that there has been described, with reference to FIG. 3, a process in which the plurality of matching adjustment values for adjusting the resonance frequency f0 are switched to each other after sensing of voice communication (S3b) is performed. However, the resonance frequency f0 can be adjusted by carrying out similar processes even after sensing other than the sensing of voice communication (such as sensing of battery charger connection (S3a)) is performed.

FIG. 5 is a view showing an example relationship in a case where the transmission level is varied from 10, which example relationship is between (A) a change in intensity of a reflected wave (reflected wave level) in accordance with control of the matching circuit 171, which intensity is obtained from a reflected voltage of a transmitted signal, and (B) a ratio of an intensity of a reflected wave to a progressive wave toward an antenna of a transmitted signal (reflected wave/progressive wave) calculated by the calculation means 151. The transmission level can be indicated by a sum total of a reflected wave level, an intensity of a signal radiated from the antenna (radiation from antenna), and a loss of a signal intensity. There will be described, with reference to FIG. 5, an example where a loss of a signal intensity is 0(zero).

As shown in FIG. 5, (1) in a case where the transmission level is 10 and the reflected wave level is 90%, i.e., 9, a signal radiated from the antenna is 10% of the transmitted signal. Next, (2) in a case where the transmission level is improved from the transmitted signal in a state of (1) to 20 and the reflected wave level is 80%, i.e., 16 by changing matching, the signal radiated from the antenna is increased to 20% of the transmitted signal. Further, (3) in a case where the transmission level is improved to 30 and the reflected wave level is 70%, i.e., 21 by changing matching, the signal radiated from the antenna is increased to 30% of the transmitted signal. Furthermore, (4) in a case where the transmission level is improved to 40, and the reflected wave level is 60%, i.e., 24 by changing matching, the signal radiated from the antenna is increased to 40% of the transmitted signal.

In the states of (1) through (4), the matching controlling means 152 selects the state (4) in which a value of the reflected wave/progressive wave calculated by the calculation means 151 is the smallest of the states (1) through (4), and controls the matching circuit 171. In this case, radiation efficiency of the antenna is 40%, so that the state (4) is the best of the states (1) through (4). That is, the state (4) has the highest transmission and reception performance.

Thus, the wireless communication device 10 in Embodiment 1 can achieve the highest transmission/reception property and a satisfactory antenna characteristic in an actual environment.

<Embodiment 2>

Figure 6:
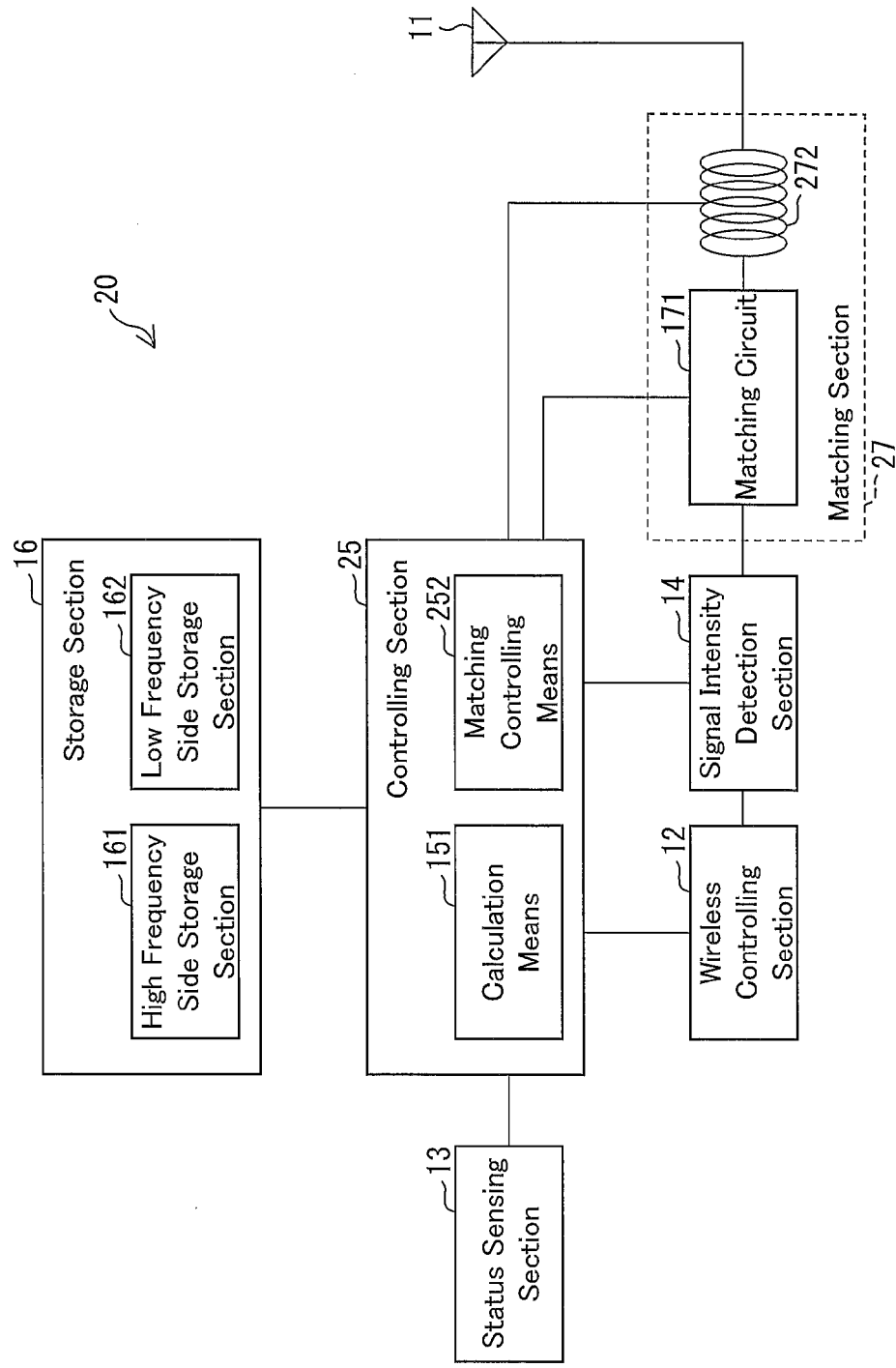
FIG. 6 is a block diagram showing an internal configuration of a wireless communication device in accordance with Embodiment 2 of the present invention.

The following description will discuss Embodiment 2 of the present invention with reference to FIG. 6.

There has been described, in Embodiment 1, a case where the variable capacitor 172 has been used as a variable element, however, the present invention is not limited thereto. Embodiment 2 will discuss a wireless communication device 20 with use of a variable inductor 272 as a variable element.

For the sake of easy explanation, members and configurations having the like functions as FIG. 1 described in Embodiment 1 are denoted by the like reference signs and the detailed description thereof is omitted.

FIG. 6 is a block diagram showing an internal configuration of the wireless communication device 20. As shown in FIG. 6, the wireless communication device 10 includes an antenna 11, a wireless controlling section 12, a status sensing section 13, a signal intensity detection section 14, a storage section 16, a controlling section 25, and a matching section 27.

The controlling section 25 collectively controls each section of the wireless communication device 20. The controlling section 25 includes calculation means 151 and matching controlling means (determination means, adjustment means) 252.

The matching controlling means 252 controls the matching section 27. Specifically, the matching controlling means 252 changes a reactance of the matching section 27 and determines, in accordance with a value of reflected wave/progressive wave calculated by the calculation means 151, whether a resonance frequency of the antenna 11 exists on the side higher than or lower than an operation frequency of the antenna 11.

Further, the matching controlling means 252 adjusts, on the basis of a result of this determination, the reactance of the matching section 27 so that the resonance frequency is closer to the operation frequency.

The matching section 27 is connected between the antenna 11 and the wireless controlling section 12, and has a variable reactance. The matching section 27 includes a matching circuit 171 and a variable inductor (variable element) 272. The matching circuit 171 switches a reactance value in accordance with a signal transmitted from the matching controlling means 252 by adjusting a resonance frequency of an antenna so that the resonance frequency is closer to an operation frequency. The variable inductor 272 is connected in series to the matching circuit 271 and is used to detect a location of the resonance frequency with use of a reactance changed by a signal transmitted from the matching controlling means 152.

The variable inductor 272 is an element for detecting a location of a resonance frequency in a case where the matching controlling means 252 changes a reactance to a negative direction, i.e., an inductance Lv of the variable inductor 272 is slightly decreased (−ΔL), and in a case where the matching controlling means 252 changes the reactance to a positive direction, i.e., the inductance Lv of the variable inductor 272 is slightly increased (+ΔL).

As described above, even the wireless communication device 20, in which the variable inductor 272 is used as a variable element, can detect a change in signal intensity, as in a wireless communication device including a variable capacitor, by slightly changing the reactance of the matching section 27. An effect produced when the inductance Lv of the variable inductor 272 is slightly decreased (−ΔL) is similar to that produced when the capacitance Cv of the variable capacitor 172 in Embodiment 1 is slightly decreased (−ΔC). Further, an effect produced when the inductance Lv of the variable inductor 272 is slightly increased (+ΔL) is similar to that produced when the capacitance Cv of the variable capacitor 172 is slightly increased (+ΔC) in Embodiment 1. Therefore, it is possible to adjust the resonance frequency by performing steps similar to those of Embodiment 1.

<Embodiment 3>

Figure 7:
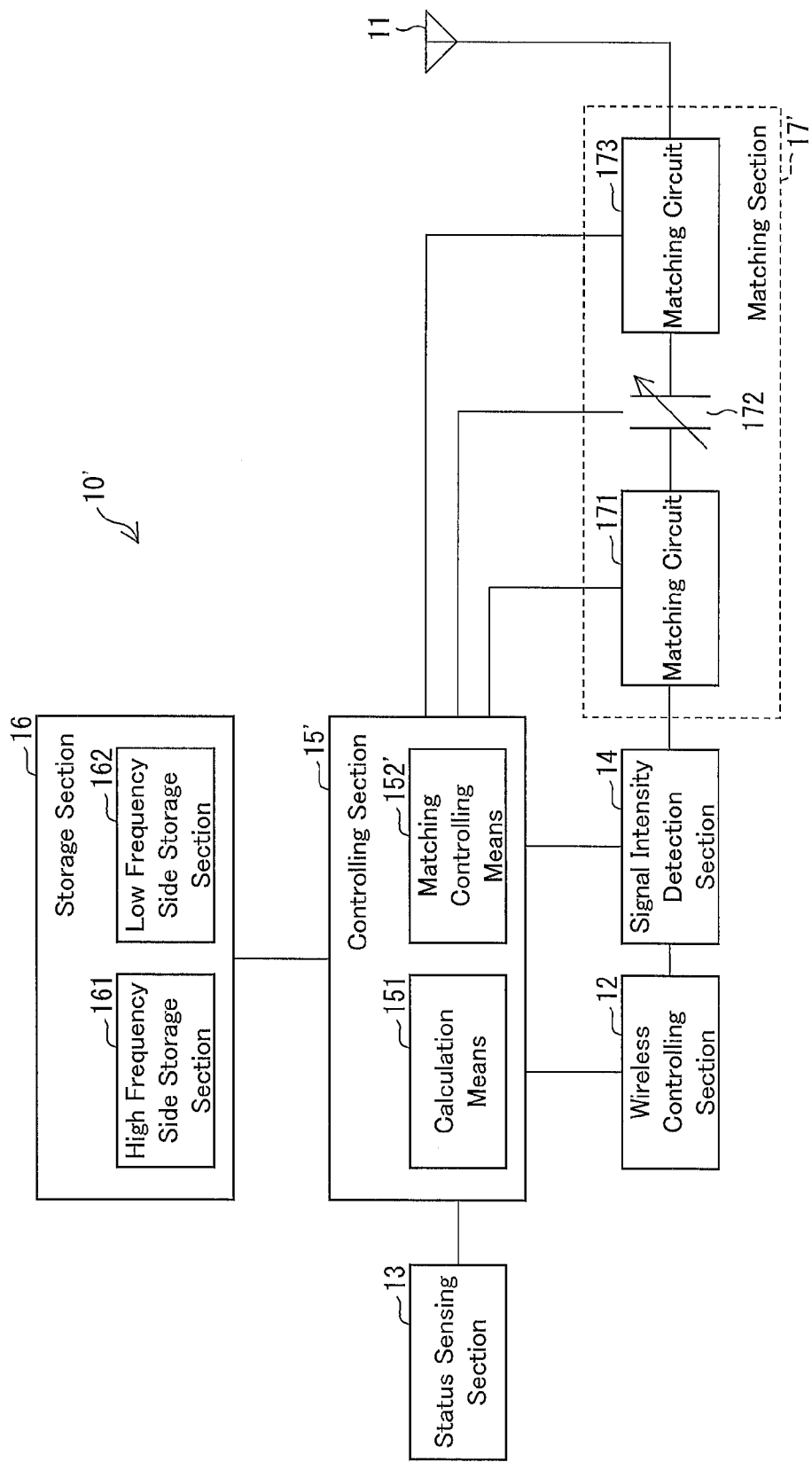
FIG. 7 is a block diagram of an internal configuration of a wireless communication device in accordance with Embodiment 3 of the present invention.

The following description will discuss Embodiment 3 of the present invention with reference to FIG. 7.

There has been described, in Embodiment 1, the matching section 17 which includes the matching circuit 171 and the variable capacitor 172 and adjusts the resonance frequency f0 in accordance with the matching adjustment value, however, the present invention is not limited thereto. The following description will discuss, in Embodiment 3, a wireless communication device 10' in which the matching section 17 of FIG. 1 further includes a matching circuit (second matching circuit) 173 for performing impedance matching.

For the sake of easy explanation, members and configurations having the like functions as FIG. 1 described in Embodiment 1 are denoted by the like reference signs and the detailed description thereof is omitted.

FIG. 7 is a block diagram showing an internal configuration of the wireless communication device 10'. As shown in FIG. 7, the wireless communication device 10' includes an antenna 11, a wireless controlling section 12, a status sensing section 13, a signal intensity detection section 14, a controlling section 15', a storage section 16, and a matching section 17'.

The controlling section 15' collectively controls each section of the wireless communication device 10'. The controlling section 15' includes calculation means 151 and matching controlling means (determination means, adjustment means) 152'.

The matching controlling means 152' controls the matching section 17'. Specifically, the matching controlling means 152' changes a reactance of the matching section 17' and determines, in accordance with a value of reflected wave/progressive wave calculated by the calculation means 151, whether a resonance frequency of the antenna 11 exists on the side higher than or lower than an operation frequency of the antenna 11.

Further, the matching controlling means 152' adjusts, on the basis of a result of this determination, the reactance of the matching section 17' so that the resonance frequency is closer to the operation frequency.

The matching section 17' is connected between the antenna 11 and the wireless controlling section 12, and has a variable reactance. The matching section 17' includes a matching circuit 171, a variable capacitor 172, and a matching circuit (second matching circuit)173.

The matching circuit 173 is located in close proximity of the antenna 11 and is an element for performing impedance matching of an antenna.

The above configuration can also produce an effect identical with that produced in Embodiment 1. Particularly, in a case where a constant of the matching circuit 173 is small, it is clear that an effect produced by the above configuration is similar to that of Embodiment 1.

<Embodiment 4>

Figure 8:
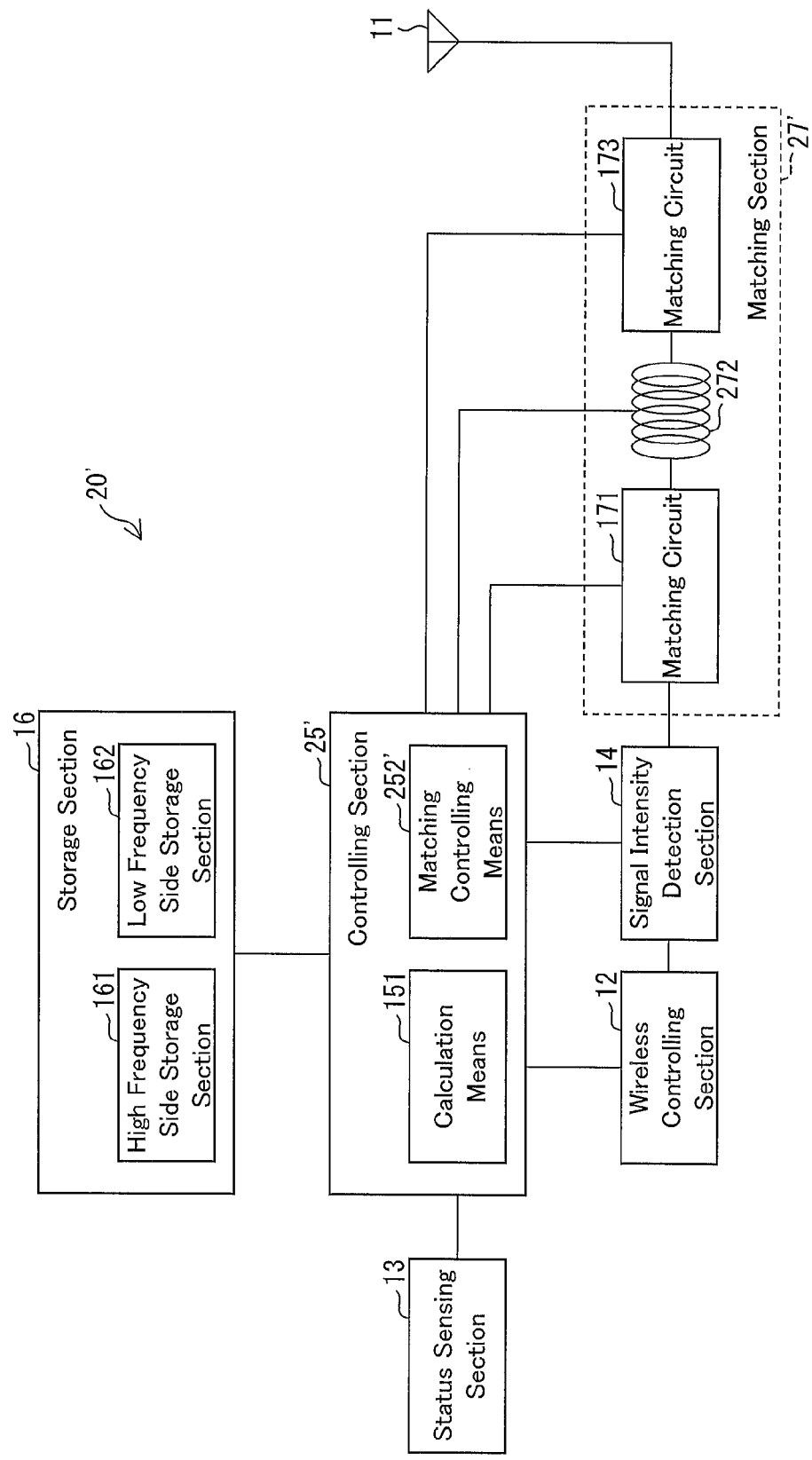
FIG. 8 is a block diagram showing an internal configuration of a wireless communication device in accordance with Embodiment 4 of the present invention.
Figure 9:
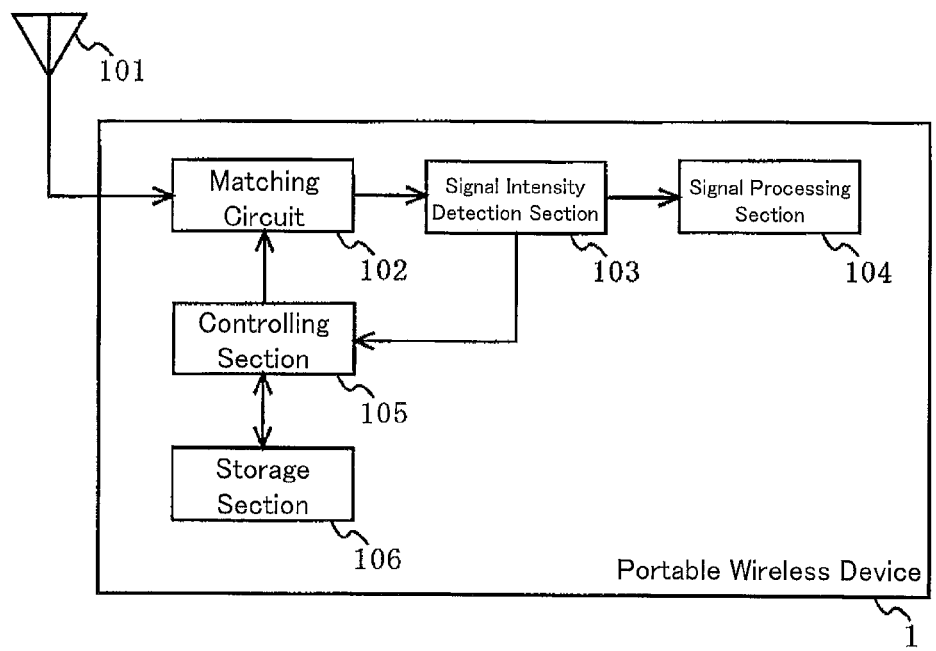
FIG. 9 is a block diagram showing an internal configuration of a conventional wireless communication device.
Figure 10:
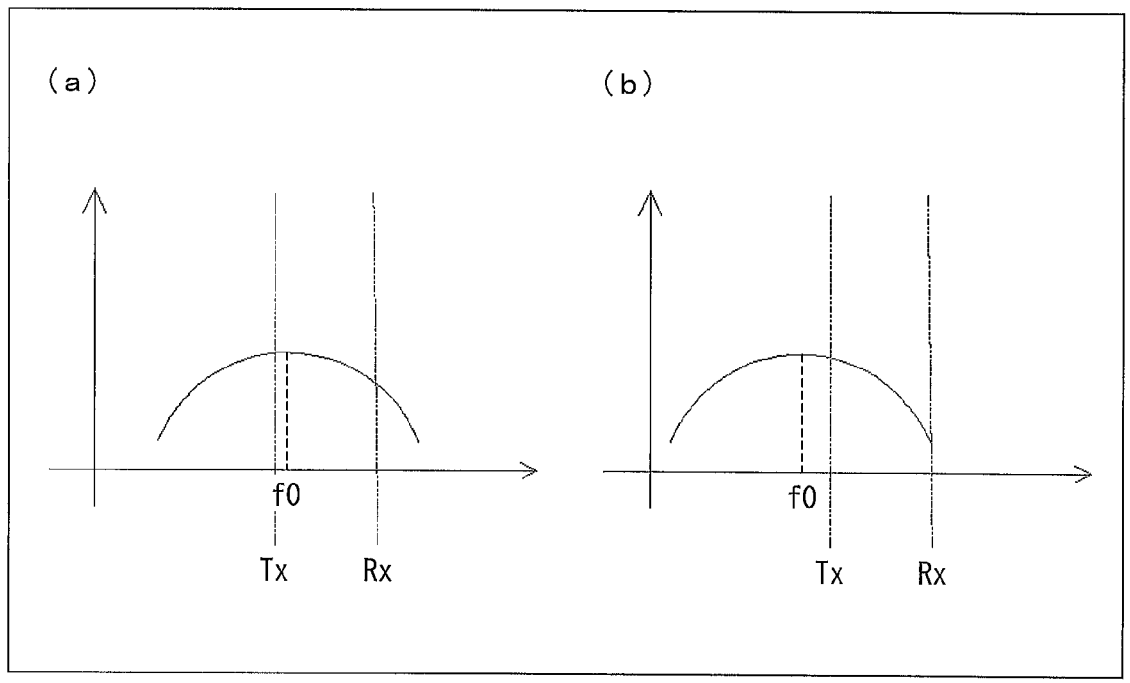
FIG. 10 is a graph showing an example relationship among resonance frequency of an antenna, a frequency of a transmitted signal, and a frequency of a received signal. (a) shows a relationship among a resonance frequency, a frequency of a transmitted signal, and a frequency of a received signal in a case where the resonance frequency is lowered, and (b) shows a relationship among a resonance frequency, a frequency of a transmitted signal, and a frequency of a received signal in a case where the resonance frequency is further lowered.

The following description will discuss Embodiment 4 of the present invention with reference to FIG. 8.

There has been described a case where the variable capacitor 172 is used as a variable element in Embodiment 3, however, the present invention is not limited thereto. The following description will discuss, in Embodiment 4, a wireless communication device 20' in which a variable inductor 272 is used as a variable element.

For the sake of easy explanation, members and configurations having the like functions as FIGS. 1, 6, and 7 described in Embodiments 1 through 3 are denoted by the like reference signs and the detailed description thereof is omitted.

FIG. 8 is a block diagram showing an internal configuration of the wireless communication device 20'. As shown in FIG. 8, the wireless communication device 20' includes an antenna 11, a wireless controlling section 12, a status sensing section 13, a signal intensity detection section 14, a storage section 16, a controlling section 25', and a matching section 27'.

The controlling section 25' collectively controls each section of the wireless communication device 20'. The controlling section 25' includes calculation means 151 and matching controlling means (determination means, adjustment means) 252'.

The matching controlling means 252' controls the matching section 27'. Specifically, the matching controlling means 252' changes a reactance of the matching section 27' and determines, in accordance with a value of reflected wave/progressive wave calculated by the calculation means 151, whether a resonance frequency of the antenna 11 exists on the side higher than or lower than an operation frequency of the antenna 11.

Further, the matching controlling means 252' adjusts, on the basis of a result of this determination, the reactance of the matching section 27' so that the resonance frequency is closer to the operation frequency.

The matching section 27' is connected between the antenna 11 and the wireless controlling section 12, and has a variable reactance. The matching section 27' includes a matching circuit 171, a variable inductor 272, and a matching circuit 173.

The above configuration can also produce an effect identical with that produced in Embodiment 2. Particularly, in a case where a constant of the matching circuit 173 is small, it is clear that an effect produced by the above configuration is similar to that of Embodiment 1.

Note that, there has been described, in Embodiments 1 through 4, a configuration in which the matching circuit 171 and the variable capacitor 172 serving as a variable element are separately provided, or a configuration in which the matching circuit 171 and the variable inductor 272 are separately provided, however, the present invention is not limited thereto. The matching circuit 171 and a variable element may be integrally provided.

<Program and Recording Medium>

Each block of the wireless communication devices 10, 10', 20, and 20' may be configured by means of hardware logic or may alternatively be realized by software with use of a CPU (Central Processing Unit) as follows.

Specifically, each of the wireless communication devices 10, 10', 20, and 20' includes a CPU (central processing unit) which carries out a command of a control program for realizing functions, a ROM (read only memory) which stores the program, a RAM (random access memory) which develops the program, and a storage apparatus (recording medium), such as a memory, which stores the program and various kinds of data. Further, the object of the present invention can be also realized in such a manner that: a recording medium is provided to the wireless communication devices 10, 10', 20, and 20', which recording medium has stored program codes (execution mode program, intermediate code program, and source program) (serving as software for realizing the aforementioned functions) of a control program in the wireless communication devices 10, 10', 20, and 20' so as to be readable by a computer; and the program codes stored in the recording medium are read out and carried out by the computer (or CPU or MPU).

Examples of the recording medium encompass: tapes such as magnetic tape and cassette tape; disks such as magnetic disks (e.g., floppy (registered trademark) disk and hard disk) and optical disks (e.g., CD-ROM, MO, MD, DVD, and CD-R); cards such as IC card (including memory card) and optical card; and semiconductor memories (e.g., mask ROM, EPROM, EEPROM, and flash ROM).

Further, the wireless communication devices 10, 10', 20, and 20' may be configured to be connect to a communication network, and the program code may be supplied via the communication network. The communication network is not particularly limited, and examples of the communication network encompass the Internet, an intranet, an extranet, a LAN, an ISDN, a VAN, a CATV communication network, a virtual private network, a telephone network, a mobile communication network, and a satellite communication network. In addition, a transmission medium constituting the communication network is not particularly limited, and examples of the transmission medium encompass: wired transmission media such as IEEE1394, a USB, a power-line carrier, a cable TV line, a telephone line, and an ADSL; and wireless transmission media such as infrared rays (e.g., IrDA and a remote controller), Bluetooth (registered trademark), 802.11 wireless, an HDR (high data rate), a cell-phone network, and a satellite line, and a digital terrestrial network. Note that the present invention may be also realized by a computer data signal which has the program codes specified with electronic transmission and is embedded in a carrier wave.

Preferred Embodiment of the Present Invention

As described above, a wireless communication device of the present invention includes: an antenna; a wireless controlling section for processing a signal that the antenna transmits and receives; a matching section which is connected between the antenna and the wireless controlling section and has a variable reactance; signal intensity detection means for detecting an intensity of the signal passed between the antenna and the wireless controlling section; adjustment means for changing the variable reactance of the matching section; and determination means for determining whether a resonance frequency of the antenna exists on a side higher than or lower than an operation frequency of the antenna on the basis of a change in the intensity, which change is caused by a change in the variable reactance and is detected by the signal intensity detection means, the adjustment means adjusting the variable reactance so that the resonance frequency is closer to the operation frequency on the basis of a result of determination of the determination means.

Further, it is preferable that, in the wireless communication device of the present invention, the operation frequency is a frequency for use in transmission via the antenna; and the determination means determines whether the resonance frequency of the antenna exists on the side higher than or lower than the operation frequency of the antenna in accordance with a change in a ratio of an intensity of a reflected wave to a progressive wave toward the antenna.

According to the configuration, it is possible to determine, on the basis of a ratio of an intensity of a reflected wave to a progressive wave, whether an antenna characteristic is improved or deteriorated (a resonance frequency of the antenna is closer to the operation frequency or away from the operation frequency). As described above, in an actual environment, in a case where a portable wireless device receives, from a base station, a request for increasing a transmission level (transmission level improving request), the portable wireless device cannot withhold the request, so that the transmission level varies. Therefore, in a case where only a progressive wave or only a reflected wave is used as a reference, a wrong result may be produced. On the contrary, in a case where a ratio of an intensity of a reflected wave to a progressive wave is used as a reference, both the progressive wave and the reflected wave are similarly changed even if the transmission level varies, so that variation of the transmission level does not influence on the reference. It is therefore possible to satisfactorily perform this determination in an actual environment. This makes it possible to achieve a wireless communication device which includes an antenna having a satisfactory property in an actual environment.

It is preferable, in the wireless communication device of the present invention, that: the determination means determines that: the resonance frequency exists on the side higher than the operation frequency in a case where the adjustment means changes the variable reactance of the matching section to a negative direction and the ratio of the intensity of the reflected wave to the progressive wave toward the antenna is increased, the resonance frequency exists on the side lower than the operation frequency in a case where the adjustment means changes the variable reactance of the matching section to the negative direction and the ratio of the intensity of the reflected wave to the progressive wave toward the antenna is decreased, the resonance frequency exists on the side lower than the operation frequency in a case where the adjustment means changes the variable reactance of the matching section to a positive direction and the ratio of the intensity of the reflected wave to the progressive wave toward the antenna is increased, and the resonance frequency exists on the side higher than the operation frequency in a case where the adjustment means changes the variable reactance of the matching section to a positive direction and the antenna the ratio of the intensity of the reflected wave to the progressive wave toward the antenna is decreased.

According to the configuration, it is possible to successfully determine whether the resonance frequency of the antenna is in a side higher than or lower than the operation frequency.

It is preferable that the wireless communication device of the present invention further includes a first storage section for storing a first matching adjustment value which defines the variable reactance to be used for raising the resonance frequency of the antenna; and a second storage section for storing a second matching adjustment value which defines the variable reactance to be used for lowering the resonance frequency of the antenna, wherein the adjustment means adjusts: the variable reactance of the matching section to a value defined by the first matching adjustment value stored in the first storage section in a case where the determination means determines that the resonance frequency of the antenna exists on the side lower than the operation frequency of the antenna; and the variable reactance of the matching section to a value defined by the second matching adjustment value stored in the second storage section in a case where the determination means determines that the resonance frequency of the antenna exists on the side higher than the operation frequency of the antenna.

According to the configuration, in a case where it is determined that the resonance frequency of the antenna on a side lower than the operation frequency, the adjustment means can cause the resonance frequency and the operation frequency to be closer to each other by raising the resonance frequency of the antenna with use of the first matching adjustment value stored in the first storage section. Meanwhile, in a case where it is determined that the resonance frequency of the antenna exists on the side higher than the operation frequency, the adjustment means can cause the resonance frequency and the operation frequency to be closer to each other by lowering the resonance frequency of the antenna with use of the second matching adjustment value stored in the second storage section.

Further, in the wireless communication device of the present invention, the operation frequency may be a frequency for use in transmission via the antenna; the first storage section may store the plurality of first matching adjustment values; the second storage section may store the plurality of second matching adjustment values; and the adjustment means may adjust the variable reactance of the matching section to such a matching adjustment value that the ratio of the intensity of the reflected wave to the progressive wave toward the antenna becomes smallest of the plurality of first matching adjustment values or becomes smallest of the plurality of second matching adjustment values.

According to the configuration, in a case where it is determined that the resonance frequency of the antenna exists on the side lower than the operation frequency, the adjustment means raises the resonance frequency of the antenna by selecting, from the plurality of first matching adjustment values stored in the first storage section, a matching adjustment value for making the best antenna characteristic and using the matching adjustment value. Therefore the adjustment means preferably cause the resonance frequency to be close to the operation frequency. Further, in a case where it is determined that the resonance frequency of the antenna exists on the side higher than the operation frequency, the adjustment means lowers the resonance frequency of the antenna by selecting, from the plurality of second matching adjustment values stored in the second storage section, a matching adjustment value for making the best antenna characteristic and using the matching adjustment value. Therefore the adjustment means preferably cause the resonance frequency to be close to the operation frequency.

It is preferable that the wireless communication device of the present invention include status sensing means for sensing a change in a status of the wireless communication device, wherein, in a case where the status sensing means senses the change in the status, the adjustment means changes the variable reactance, the determination means carries out said determination, and the adjustment means adjusts the variable reactance.

In the wireless communication device of the present invention, the status sensing means may sense, as the change in the status, start of charging of the wireless communication device.

In the wireless communication device of the present invention, the status sensing means may sense, as the change in the status, start of voice communication with use of the wireless controlling section.

The wireless communication device of the present invention may further include a telephone communication button for receiving a start instruction of voice communication, wherein the status sensing means senses, as the change in the status, push of the telephone communication button.

The wireless communication device of the present invention may further include a proximity sensor, wherein the status sensing means senses, as the change in the status, proximity of an external object to the proximity sensor.

In the wireless communication device of the present invention, the status sensing means may sense, as the change in the status, start of data communication with use of the wireless controlling section.

According to the configuration, it is possible to maintain a satisfactory communication status because the resonance frequency can be adjusted at a timing at which the resonance frequency needs adjustment.

In the wireless communication device of the present invention, the status sensing means may sense the change in the status on the basis of the change in the intensity detected by the signal intensity detection means.

According to the configuration, in a case where the status sensing means can determine that the status of the wireless communication device is changed in a case where, for example, the intensity of the signal is remarkably deteriorated. Therefore, the status sensing means can successfully senses necessity of adjustment of the resonance frequency due to a change in an actual environment.

It is preferable, in the wireless communication device of the present invention, that the matching section include: a first matching circuit for adjusting the resonance frequency of the antenna so that the resonance frequency is closer to the operation frequency with use of the variable reactance adjusted by the adjustment means; and a variable element which is connected in series to the matching circuit and changes a signal intensity with use of the variable reactance changed by the adjustment means.

In the wireless communication device of the present invention, the variable element may be a variable capacitor or may be a variable inductor. Further, in the wireless communication device of the present invention, the matching section may further include a second matching circuit for causing the antenna and the wireless controlling section to be subjected to impedance matching.

According to the configuration, because the reactance of the matching section can be successfully changed, it is possible to successfully determine whether to raise or lower the resonance frequency in order that the determination means improves the antenna characteristic.

Further, the present invention encompasses a program for operating the wireless communication device and causing a computer to have a function of the wireless communication device and a computer readable recording medium in which the program is stored.

The present invention is not limited to the description of the embodiments above, and can be modified in numerous ways by a skilled person as long as such modification falls within the scope of the claims. An embodiment derived from a proper combination of technical means disclosed in different embodiments is also encompassed in the technical scope of the present invention.

INDUSTRIAL APPLICABILITY

The present invention can be widely used for a wireless communication device.

REFERENCE SIGNS LIST 10, 10' wireless communication device
11 antenna
12 wireless controlling section
13 status sensing section (status sensing means)
14 signal intensity detection section (signal intensity detection means)
15, 15' controlling section 151 calculation means (determination means)
152, 152' matching controlling means (determination means, adjustment means)
16 storage section
161 high frequency side storage section (first storage section)
162 low frequency side storage section (second storage section)
17, 17' matching section
171 matching circuit (first matching circuit)
172 variable capacitor (variable element)
173 matching circuit (second matching circuit)
20, 20' wireless communication device
25, 25' controlling section
252, 252' matching controlling means (determination means, adjustment means)
27, 27' matching section
272 variable inductor (variable element)

The invention claimed is:

1. A wireless communication device, comprising:
an antenna;
a wireless controlling circuit for processing a signal that the antenna transmits and receives;
a matching section which is connected between the antenna and the wireless controlling circuit and has a variable reactance;
signal detector for detecting an intensity of the signal passed between the antenna and the wireless controlling circuit;
controller for changing the variable reactance of the matching section;
the controller determining whether a resonance frequency of the antenna exists on a side higher than or lower than an operation frequency of the antenna on the basis of a change in the intensity which is caused by a change in the variable reactance; and
a storage section in which a plurality of matching adjustment values for defining the variable reactance,
the controller further adjusting the variable reactance to a value defined by one of the plurality of matching adjustment values so that the resonance frequency is closer to the operation frequency on the basis of a result of determination of the controller, wherein:
the operation frequency is a frequency for use in transmission via the antenna; and
the controller determines whether the resonance frequency of the antenna exists on the side higher than or lower than the operation frequency of the antenna in accordance with a change in a ratio of an intensity of a reflected wave to a progressive wave toward the antenna, wherein
the controller determines that:
the resonance frequency exists on the side higher than the operation frequency in a case where the controller changes the variable reactance of the matching section to a negative direction and the ratio of the intensity of the reflected wave to the progressive wave toward the antenna is increased,
the resonance frequency exists on the side lower than the operation frequency in a case where the controller changes the variable reactance of the matching section to the negative direction and the ratio of the intensity of the reflected wave to the progressive wave toward the antenna is decreased,
the resonance frequency exists on the side lower than the operation frequency in a case where the controller changes the variable reactance of the matching section to a positive direction and the ratio of the intensity of the reflected wave to the progressive wave toward the antenna is increased, and
the resonance frequency exists on the side higher than the operation frequency in a case where the controller changes the variable reactance of the matching section to a positive direction and the antenna the ratio of the intensity of the reflected wave to the progressive wave toward the antenna is decreased.

2. A wireless communication device, comprising:
an antenna;
a wireless controlling circuit for processing a signal that the antenna transmits and receives;
a matching section which is connected between the antenna and the wireless controlling circuit and has a variable reactance;
signal detector for detecting an intensity of the signal passed between the antenna and the wireless controlling circuit;
controller for changing the variable reactance of the matching section;
controller for determining whether a resonance frequency of the antenna exists on a side higher than or lower than an operation frequency of the antenna on the basis of a change in the intensity which is caused by a change in the variable reactance; and
a storage section in which a plurality of matching adjustment values for defining the variable reactance,
the controller further adjusting the variable reactance to a value defined by one of the plurality of matching adjustment values so that the resonance frequency is closer to the operation frequency on the basis of a result of determination. of the controller, wherein:
the storage section includes
a first storage section for storing a first matching adjustment value which defines the variable reactance to be used for raising the resonance frequency of the antenna, and
a second storage section for storing a second matching adjustment value which defines the variable reactance to be used for lowering the resonance frequency of the antenna;
the controller adjusts
the variable reactance of the matching section to a value defined by the first matching adjustment value stored in the first storage section in a case where the controller determines that the resonance frequency of the antenna exists on the side lower than the operation frequency of the antenna, and
the variable reactance of the matching section to a value defined by the second matching adjustment value stored in the second storage section in a case where the controller determines that the resonance frequency of the antenna exists on the side higher than the operation frequency of the antenna.

3. The wireless communication device as set forth in claim 2, wherein:
the operation frequency is a frequency for use in transmission via the antenna;
the first storage section stores the plurality of first matching adjustment values;
the second storage section stores the plurality of second matching adjustment values; and
the controller adjusts the variable reactance of the matching section to such a matching adjustment value that the ratio of the intensity of the reflected wave to the progressive wave toward the antenna becomes smallest of the plurality of first matching adjustment values or becomes smallest of the plurality of second matching adjustment values.

4. The wireless communication device as set forth in claim 1, further comprising:
status sensing means for sensing a change in a status of the wireless communication device,
wherein, in a case where the status sensing means senses the change in the status, the controller changes the variable reactance, the controller carries out said determination, and the controller adjusts the variable reactance.

5. The wireless communication device as set forth in claim 4,
wherein the status sensing means senses, as the change in the status, start of charging of the wireless communication device.

6. The wireless communication device as set forth in claim 4,
wherein the status sensing means senses, as the change in the status, start of voice communication with use of the wireless controlling circuit.

7. The wireless communication device as set forth in claim 4,
further comprising a telephone communication button for receiving a start instruction of voice communication,
wherein the status sensing means senses, as the change in the status, push of the telephone communication button.

8. The wireless communication device as set forth in claim 4,
further comprising a proximity sensor,
wherein the status sensing means senses, as the change in the status, proximity of an external object to the proximity sensor.

9. The wireless communication device as set forth in claim 4,
wherein the status sensing means senses, as the change in the status, start of data communication with use of the wireless controlling circuit.

10. The wireless communication device as set forth in claim 4,
wherein the status sensing means senses the change in the status on the basis of the change in the intensity detected by the signal detector.

11. The wireless communication device as set forth in claim 1,
wherein the matching section includes:
a first matching circuit for adjusting the resonance frequency of the antenna so that the resonance frequency is closer to the operation frequency with use of the variable reactance adjusted by the controller; and
a variable element which is connected in series to the first matching circuit and changes a signal intensity with use of the variable reactance changed by the controller.

12. The wireless communication device as set forth in claim 11,
wherein the variable element is a variable capacitor.

13. The wireless communication device as set forth in claim 11,
wherein the variable element is a variable inductor.

14. The wireless communication device as set forth in claim 1,
wherein the matching section further includes a second matching circuit for performing impedance matching between the antenna and the wireless controlling circuit.

15. A method for controlling a wireless communication device including (i) an antenna, (ii) a wireless controlling circuit for processing a signal that the antenna transmits and receives, (iii) a matching section which is connected between the antenna and the wireless controlling circuit and has a variable reactance, and (iv) a storage section in which a plurality of matching adjustment values for defining the variable reactance, the method comprising:

detecting an intensity of the signal passed between the antenna and the wireless controlling circuit;

changing the variable reactance of the matching section;

determining whether a resonance frequency of the antenna exists on a side higher than or lower than an operation frequency of the antenna on the basis of a change in the intensity which is caused by a change in the variable reactance; and adjusting the variable reactance to a value defined by one of the plurality of matching adjustment values so that the resonance frequency is closer to the operation frequency on the basis of a result of said determining, wherein:

the operation frequency is a frequency for use in transmission via the antenna; and the determining determines whether the resonance frequency of the antenna exists on the side higher than or lower than the operation frequency of the antenna in accordance with a change in a ratio of an intensity of a reflected wave to a progressive wave toward the antenna, wherein the determining determines that:

the resonance frequency exists on the side higher than the operation frequency in a case where the changing changes the variable reactance of the matching section to a negative direction and the ratio of the intensity of the reflected wave to the progressive wave toward the antenna is increased, the resonance frequency exists on the side lower than the operation frequency in a case where the changing changes the variable reactance of the matching section to the negative direction and the ratio of the intensity of the reflected wave to the progressive wave toward the antenna is decreased, the resonance frequency exists on the side lower than the operation frequency in a case where the changing changes the variable reactance of the matching section to a positive direction and the ratio of the intensity of the reflected wave to the progressive wave toward the antenna is increased, and the resonance frequency exists on the side higher than the operation frequency in a case where the changing changes the variable reactance of the matching section to a positive direction and the antenna the ratio of the intensity of the reflected wave to the progressive wave toward the antenna is decreased.

16. A non-transitory computer readable recording medium which stores a control program for causing a computer to function as the controller of a wireless communication device recited in claim 1.

17. A non-transitory computer readable recording medium which stores a control program for causing a computer to function as the controller of a wireless communication device recited in claim 2.

* * * * *